US008792277B2

(12) United States Patent
Eggleston et al.

(10) Patent No.: US 8,792,277 B2
(45) Date of Patent: *Jul. 29, 2014

(54) SPLIT DATA ERROR CORRECTION CODE CIRCUITS

(71) Applicant: Micron Technology, Inc., Boise, ID (US)

(72) Inventors: David Eggleston, San Jose, CA (US); Anthony Moschopoulos, Quebec (CA); Michael Murray, Mountain View, CA (US); Brady L. Keays, Half Moon Bay, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/027,381

(22) Filed: Sep. 16, 2013

(65) Prior Publication Data
US 2014/0019826 A1    Jan. 16, 2014

Related U.S. Application Data

(60) Continuation of application No. 13/108,460, filed on May 16, 2011, now Pat. No. 8,537,614, which is a continuation of application No. 12/470,183, filed on May 21, 2009, now Pat. No. 7,944,748, which is a division of application No. 11/489,321, filed on Jul. 19, 2006, now Pat. No. 7,545,682, which is a division of application No. 11/004,454, filed on Dec. 3, 2004, now Pat. No. 7,193,899, which is a division of application No. 10/602,991, filed on Jun. 24, 2003, now Pat. No. 6,906,961.

(51) Int. Cl.
G11C 16/06    (2006.01)

(52) U.S. Cl.
USPC ............. 365/185.09; 365/185.05; 365/185.11

(58) Field of Classification Search
USPC ........................ 365/185.09, 185.11, 185.05
See application file for complete search history.

(56) References Cited

U.S. PATENT DOCUMENTS

| 5,077,737 | A |   | 12/1991 | Leger et al. |
| 5,276,834 | A |   | 1/1994  | Mauritz et al. |
| 5,359,569 | A | * | 10/1994 | Fujita et al. .................. 365/229 |
| 5,375,222 | A |   | 12/1994 | Robinson et al. |
| 5,559,980 | A |   | 9/1996  | Connors et al. |
| 5,572,466 | A |   | 11/1996 | Sukegawa |
| 5,648,929 | A |   | 7/1997  | Miyamoto |
| 5,732,208 | A |   | 3/1998  | Tamura et al. |
| 5,740,349 | A |   | 4/1998  | Hasbun et al. |
| 5,748,528 | A |   | 5/1998  | Campardo et al. |
| 5,751,733 | A |   | 5/1998  | Glover |
| 5,754,567 | A |   | 5/1998  | Norman |
| 5,854,800 | A |   | 12/1998 | Thomann et al. |

(Continued)

Primary Examiner — Pho M Luu
(74) Attorney, Agent, or Firm — Dicke, Billig & Czaja, PLLC

(57) ABSTRACT

Split data error correction code (ECC) circuits including a control circuit coupled to an error correction code (ECC) circuit. The ECC circuit is adapted to generate at least one ECC code from user data of a first physical sector during a data access. The split data ECC circuit is adapted to write the at least one ECC code to a second physical sector if the data access is a write access and to compare the at least one generated ECC code with at least one ECC code stored in a second physical sector if the data access is a read access.

20 Claims, 12 Drawing Sheets

(56) References Cited

U.S. PATENT DOCUMENTS

| | | | |
|---|---|---|---|
| 5,864,569 A | 1/1999 | Roohparvar | |
| 5,923,682 A | 7/1999 | Seyyedy | |
| 5,983,312 A | 11/1999 | Komatsu et al. | |
| 5,999,446 A | 12/1999 | Harari et al. | |
| 6,034,891 A | 3/2000 | Norman | |
| 6,076,182 A | 6/2000 | Jeddeloh | |
| 6,081,878 A | 6/2000 | Estakhri et al. | |
| 6,202,138 B1 | 3/2001 | Estakhri et al. | |
| 6,262,918 B1 | 7/2001 | Estakhri et al. | |
| 6,272,610 B1 | 8/2001 | Katayama et al. | |
| 6,279,072 B1 | 8/2001 | Williams et al. | |
| 6,310,740 B1 | 10/2001 | Dunbar et al. | |
| 6,728,851 B1 | 4/2004 | Estakhri et al. | |
| 6,757,842 B2 | 6/2004 | Harari et al. | |
| 6,906,691 B2 | 6/2005 | Park et al. | |
| 6,944,063 B2 | 9/2005 | Chen et al. | |
| 7,012,845 B2 * | 3/2006 | Kozakai et al. | 365/200 |
| 7,032,065 B2 | 4/2006 | Gonzalez et al. | |
| 7,117,421 B1 | 10/2006 | Danilak | |
| 7,155,559 B1 | 12/2006 | Estakhri et al. | |
| 7,193,899 B2 | 3/2007 | Eggleston et al. | |
| 7,480,762 B2 | 1/2009 | Eggleston et al. | |
| 7,545,682 B2 | 6/2009 | Eggleston et al. | |
| 7,944,748 B2 * | 5/2011 | Eggleston et al. | 365/185.11 |
| 7,978,512 B2 * | 7/2011 | Shiga | 365/185.03 |
| 8,086,919 B2 | 12/2011 | Chen et al. | |
| 8,503,235 B2 * | 8/2013 | Katayama et al. | 365/185.08 |
| 8,537,614 B2 * | 9/2013 | Eggleston et al. | 365/185.11 |
| 2003/0041210 A1 | 2/2003 | Keays | |
| 2003/0115538 A1 | 6/2003 | Derner et al. | |

* cited by examiner

Fig. 4A

| 400 | 406 | 408 | 410 | 412 | |
|---|---|---|---|---|---|
| 414 Sector 0 | 1 | 4 | 414 Sector 0 | 3 | 2 | }416
| 414 Sector 1 | 5 | 8 | 414 Sector 1 | 7 | 6 |
| 414 Sector 2 | | | 414 Sector 2 | | |
| 414 Sector 3 | | 2 | 414 Sector 3 | 1 | | }418
| 414 Sector 4 | 3 | 6 | 414 Sector 4 | 5 | 4 |
| 414 Sector 5 | 7 | | 414 Sector 5 | | 8 |
| 414 Sector 6 | | | 414 Sector 6 | | |
| 402 Erase Block N | | | 404 Erase Block N+Y | | |

Fig. 4B

| 450 | 456 | 458 | 460 | 462 | |
|---|---|---|---|---|---|
| 464 Sector 0 | 1 | B | 464 Sector 0 | A | 2 | }466
| 464 Sector 1 | 3 | D | 464 Sector 1 | C | 4 |
| 464 Sector 2 | . | . | 464 Sector 2 | . | . |
| 464 Sector 3 | : | : | 464 Sector 3 | : | : |
| 464 Sector 4 | | | 464 Sector 4 | | |
| 464 Sector 5 | | | 464 Sector 5 | | |
| 464 Sector 6 | | | 464 Sector 6 | | |
| 452 Erase Block N | | | 454 Erase Block N+Y | | |

Fig. 4C

| 470 | 476 | 478 | 480 | 482 | |
|---|---|---|---|---|---|
| 484 Sector 0 | A | o/h P | 484 Sector 0 | B | o/h A | }486
| 484 Sector 1 | C | o/h B | 484 Sector 1 | D | o/h C |
| 484 Sector 2 | E | o/h D | 484 Sector 2 | F | o/h E |
| 484 Sector 3 | . | . | 484 Sector 3 | . | . |
| 484 Sector 4 | : | : | 484 Sector 4 | : | : |
| 484 Sector 5 | | | 484 Sector 5 | | |
| 484 Sector 6 | | | 484 Sector 6 | | |
| 472 Erase Block N | | | 474 Erase Block N+Y | | |
| 484 Sector X-1 | M | o/h K | 484 Sector X-1 | N | o/h M |
| 484 Sector X | O | o/h N | 484 Sector X | P | o/h O |

SPLIT DATA ERROR CORRECTION CODE CIRCUITS

RELATED APPLICATIONS

This Application is a continuation of U.S. application Ser. No. 13/108,460, filed May 16, 2011, now U.S. Pat. No. 8,537,614, which is a continuation of U.S. application Ser. No. 12/470,183, filed May 21, 2009, now U.S. Pat. No. 7,944,748, which is a divisional of U.S. application Ser. No. 11/489,321, filed Jul. 19, 2006, now U.S. Pat. No. 7,545,682, issued Jun. 9, 2009, which application is a divisional of U.S. application Ser. No. 11/004,454, filed Dec. 3, 2004, now U.S. Pat. No. 7,193,899, issued Mar. 20, 2007, which application is a divisional of U.S. application Ser. No. 10/602,991, filed Jun. 24, 2003, now U.S. Pat. No. 6,906,961, issued Jun. 14, 2005, and all of which applications are commonly assigned and incorporated herein by reference.

TECHNICAL FIELD

The present invention relates generally to integrated circuits and in particular the present invention relates to data management of Flash memory devices.

BACKGROUND

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations, respectively.

Yet another type of non-volatile memory is a Flash memory. A Flash memory is a type of EEPROM that can be erased and reprogrammed in blocks instead of one byte at a time. A typical Flash memory comprises a memory array, which includes a large number of memory cells. Each of the memory cells includes a floating gate field-effect transistor capable of holding a charge. The data in a cell is determined by the presence or absence of the charge in the floating gate. The cells are usually grouped into sections called "erase blocks". The memory cells of a Flash memory array are typically arranged into a "NOR" architecture (each cell directly coupled to a bitline) or a "NAND" architecture (cells coupled into "strings" of cells, such that each cell is coupled indirectly to a bitline and requires activating the other cells of the string for access). Each of the cells within an erase block can be electrically programmed in a random basis by charging the floating gate. The charge can be removed from the floating gate by a block erase operation, wherein all floating gate memory cells in the erase block are erased in a single operation.

FIG. 1 shows a simplified diagram of a Flash memory subsystem 134 of the prior art. In the Flash memory subsystem 134, a Flash memory controller 130 is coupled 132 to one or more Flash memory devices 100. The Flash memory controller 130 contains a control state machine 110 that directs the operation of the Flash memory device(s) 100; managing the Flash memory array 112 and updating internal RAM control registers and tables 114 and the non-volatile erase block management registers and tables 128. The RAM control registers and tables 114 are loaded at power up from the non-volatile erase block management registers and tables 128 by the control state machine 110. The Flash memory array 112 of each Flash memory device 100 contains a sequence of erase blocks 116. Each erase block 116 contains a series of sectors 118 that are typically each written to a single row of the memory array 112 and include a user data space or area 120 and an associated control or overhead data space or area 122. The control/overhead data space 122 contains overhead information for operation of the sector it is associated with. Such overhead information typically includes, but is not limited to, erase block management (EBM) data, sector status information, or an error correction code (ECC, not shown). ECC's allow the Flash memory 100 and/or the Flash memory controller 130 to detect data errors in the user data space 120 and attempt to recover the user data if possible.

The user data space 120 in each sector 118 is typically one or more multiples of 512 bytes long (depending on memory array 112 row size), wherein one or more logical operating system (OS) sectors of 512 bytes each or multiple logically addressed data words can be stored on the row or sector 118. In a typical Flash memory device 100 each erase block 116 typically contains 16 or more physical sectors 118. Each new 512 bytes of user data and its associated overhead data are together written into an available erase block sector 118 (i.e., User data A with Overhead data A within a single erase block sector 118) as the user data arrives at the Flash memory 100. User data is typically written sequentially into the sectors 118 of an erase block 116 until it is filled. It is noted that other configurations of Flash memory subsystems 134, having Flash memory devices 100 and Flash memory controllers 130, are well known in the art, including such devices that integrate the functions of the separate Flash memory controller and Flash memory device into a single device.

A problem with Flash memories is that each erase block sector 118 stores the user data and the overhead information, which includes the error correction codes, within close proximity to each other or, alternatively, on the same physical row of the memory array 112. Because of this, an error in one or more sectors 118 of an erase block 116 of the Flash memory 100 due to physical damage, impurity migration, write fatigue, electrical transients, or another reason can also affect the overhead data associated with those sectors. This increases the likelihood of a loss of data (if the ECC is damaged also) or even the loss of the ability to access the affected sector occurring (if the sector management data is damaged) when such an error happens.

For the reasons stated above, and for other reasons stated below which will become apparent to those skilled in the art upon reading and understanding the present specification, there is a need in the art for a Flash memory device or Flash memory handing routine that has a fault tolerant erase block sector architecture and data/overhead information storage method.

BRIEF DESCRIPTION OF THE DRAWINGS

FIGS. 4A, 4B, 4C, and 4D detail sector write/read order of an erase block super block of a Flash memory in accordance with embodiments of the present invention.

DETAILED DESCRIPTION

Figure 1:
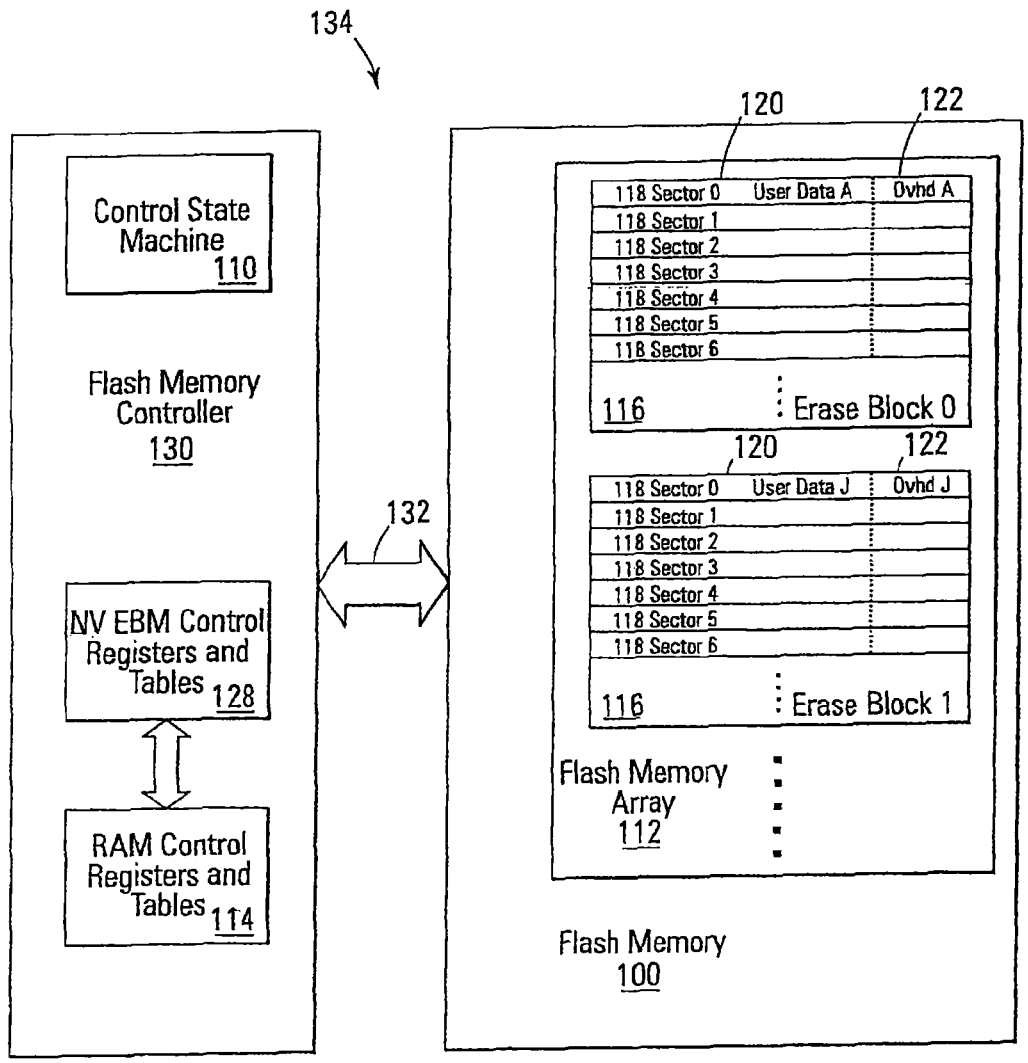
FIG. 1 details a prior art Flash memory.

In the following detailed description, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

To improve data reliability in Flash memories, a Flash memory device, system, or data handling routine in accordance with an embodiment of the present invention splits the user data from the associated overhead data, storing each in separate Flash memory devices, differing erase blocks, or differing sectors of an erase block in a distributed approach. This avoids the issue of potential corruption of both the user data and overhead data due to each being held within close proximity to each other or on the same wordline (row) in the same erase block sector. A Flash memory embodiment of the present invention stores the user data in the user data area of a sector of an erase block and the associated overhead data in the overhead data area of a sector of a different erase block. This provides separation of the user data and its associated overhead data, allowing for an increased possibility of data recovery in case of a corruption of the user data and/or overhead data stored in either erase block. In one embodiment of the present invention a Flash memory has a sequence of paired erase blocks (super blocks), such that the overhead data areas of the sectors of each erase block of an erase block super block pair are stored in the paired companion erase block. In another embodiment of the present invention a Flash memory has a sequence of paired erase blocks and a dedicated hardware system to automatically read/write user data from/to one erase block of an erase block pair and read/write the associated overhead data from/to the overhead data area of the companion erase block to improve the speed of the user data/overhead data splitting operation. In another embodiment of the present invention a Flash memory has a state machine or firmware control of erasure of paired erase blocks of a super block pair and state machine/firmware control of allocation of newly erased super block erase block pairs for use. In yet another embodiment of the present invention a Flash memory replaces a set of paired erase blocks that have become damaged by allocating spare replacement erase blocks in a replacement super block under hardware control. In a further embodiment of the present invention a Flash memory replaces one erase block of a set of paired erase blocks that have become damaged by allocating a spare replacement erase block under firmware control. In another embodiment of the present invention a NAND Flash memory has a data splitting controller that generates data splitting addresses from a start address. In yet another embodiment, an ECC circuit generates read/write ECC data in a data splitting configuration.

As stated above, the two common types of Flash memory array architectures are the "NAND" and "NOR" architectures, so called for the similarity each basic memory cell configuration has to the corresponding logic gate design. In the NOR array architecture, the floating gate memory cells of the memory array are arranged in a matrix similar to RAM or ROM. The gates of each floating gate memory cell of the array matrix are coupled by rows to word select lines (word lines) and their drains are coupled to column bit lines. The source of each floating gate memory cell is typically coupled to a common source line. The NOR architecture floating gate memory array is accessed by a row decoder activating a row of floating gate memory cells by selecting the word line coupled to their gates. The row of selected memory cells then place their stored data values on the column bit lines by flowing a differing current if in a programmed state or not programmed state from the coupled source line to the coupled column bit lines. A column page of bit lines is selected and sensed, and individual data words are selected from the sensed data words from the column page and communicated from the Flash memory.

A NAND array architecture also arranges its array of floating gate memory cells in a matrix such that the gates of each floating gate memory cell of the array are coupled by rows to word lines. However each memory cell is not directly coupled to a source line and a column bit line. Instead, the memory cells of the array are arranged together in strings, typically of 8, 16, or more each, where the memory cells in the string are coupled together in series, source to drain, between a common source line and a column bit line. This allows a NAND Flash array architecture to have a higher memory cell density than a comparable NOR Flash array, but with the cost of a generally slower access rate and programming complexity.

A NAND architecture floating gate memory array is accessed by a row decoder activating a row of floating gate memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate memory cell of the series coupled string, restricted only by the memory cells of each string that are selected to be read. This places the current encoded stored data values of the row of selected memory cells on the column bit lines. A column page of bit lines is selected and sensed, and then individual data words are selected from the sensed data words from the column page and communicated from the Flash memory.

Because all the cells in an erase block of a Flash memory device must be erased all at once, one cannot directly rewrite a Flash memory cell without first engaging in a block erase operation. Erase block management (EBM), typically under the control of an internal state machine or device firmware, provides an abstraction layer for this to the host (a processor or an external memory controller), allowing the Flash device to appear as a freely rewriteable device, including, but not limited to, managing the logical address to physical erase block translation mapping for reads and writes, the assignment of erased and available erase blocks for utilization, and the scheduling erase blocks that have been used and closed out for block erasure. Erase block management also allows for load leveling of the internal floating gate memory cells to help prevent write fatigue failure. Write fatigue is where the floating gate memory cell, after repetitive writes and erasures, no longer properly erases and removes charge from the floating gate. Load leveling procedures increase the mean time between failure of the erase block and Flash memory device as a whole.

In many modern Flash memory device implementations, the host interface and erase block management routines additionally allow the Flash memory device to appear as a read/write mass storage device (i.e., a magnetic disk) to the host. One such approach is to conform the interface to the Flash memory to be identical to a standard interface for a conventional magnetic hard disk drive allowing the Flash memory device to appear as a block read/write mass storage device or disk. This approach has been codified by the Personal Computer Memory Card International Association (PCMCIA), Compact Flash (CF), and Multimedia Card (MMC) standardization committees, which have each promulgated a standard for supporting Flash memory systems or Flash memory "cards" with a hard disk drive protocol. A Flash memory device or Flash memory card (including one or more Flash memory array chips) whose interface meets these standards can be plugged into a host system having a standard DOS or compatible operating system with a Personal Computer Memory Card International Association-Advanced Technology Attachment (PCMCIA-ATA) or standard ATA interface. Other additional Flash memory based mass storage devices of differing low level formats and interfaces also exist, such as Universal Serial Bus (USB) Flash drives.

Many of the modern computer operating systems, such as "DOS" (Disk Operating System), were developed to support the physical characteristics of hard drive structures; supporting file structures based on heads, cylinders and sectors. The DOS software stores and retrieves data based on these physical attributes. Magnetic hard disk drives operate by storing polarities on magnetic material. This material is able to be rewritten quickly and as often as desired. These characteristics have allowed DOS to develop a file structure that stores files at a given location which is updated by a rewrite of that location as information is changed. Essentially all locations in DOS are viewed as fixed and do not change over the life of the disk drive being used therewith, and are easily updated by rewrites of the smallest supported block of this structure. A sector (of a magnetic disk drive) is the smallest unit of storage that the DOS operating system supports. In particular, a sector has come to mean 512 bytes of information for DOS and most other operating systems in existence. Flash memory systems that emulate the storage characteristics of hard disk drives are preferably structured to support storage in 512 byte blocks along with additional storage for overhead associated with mass storage, such as ECC (error correction code) bits, status flags for the sector or erase block, and/or redundant bits.

Figure 2A:
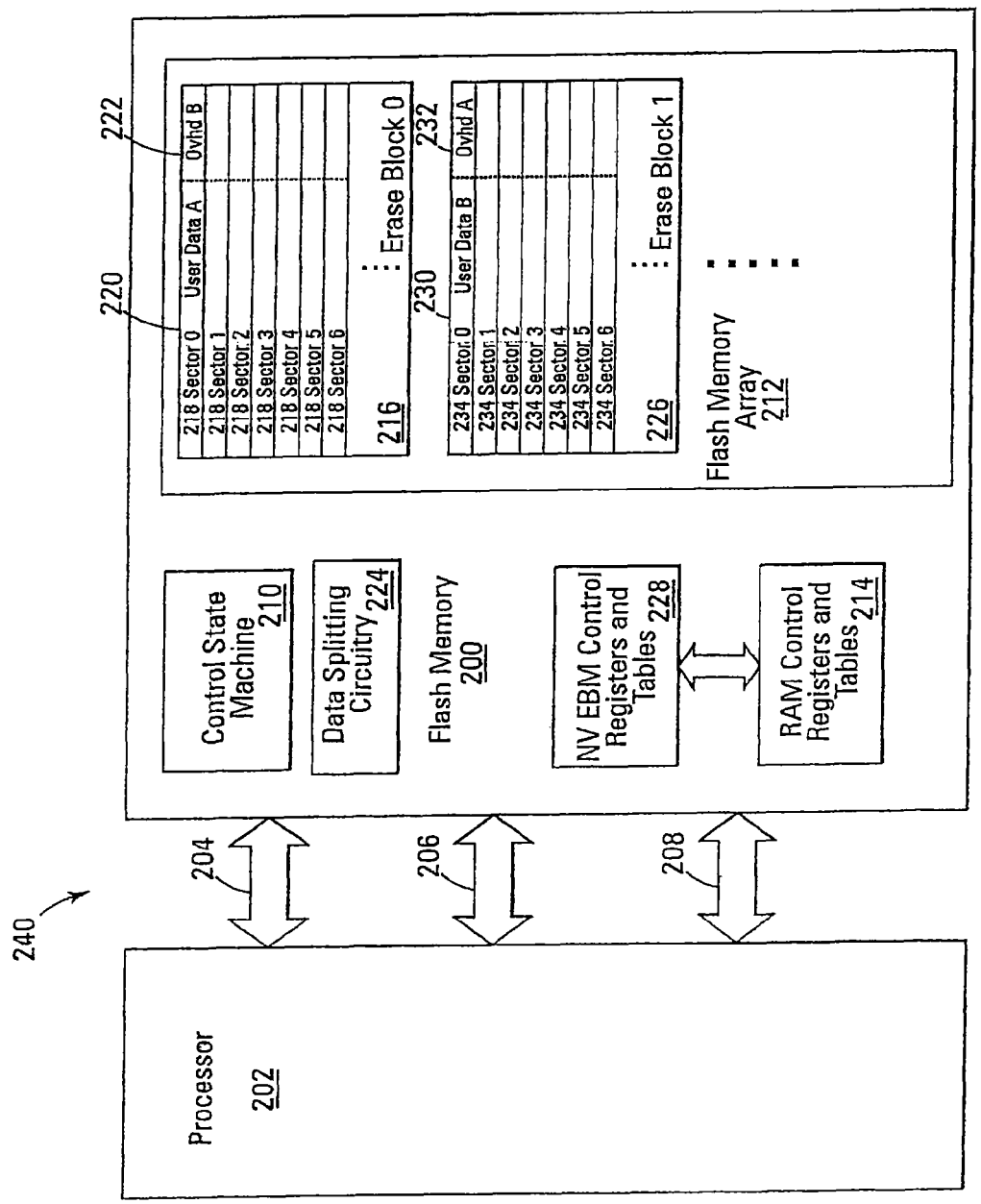
FIGS. 2A and 2B detail memory systems with Flash memory in accordance with embodiments of the present invention.

FIG. 2A is a simplified diagram of a computer system 240 that incorporates a Flash memory device 200 embodiment of the present invention. In the computer system 240 of FIG. 2A, the Flash memory 200 is coupled to a processor 202 with an address 204, control 206, and data bus 208. Internally to the Flash memory device, a control state machine 210 directs internal operation of the Flash memory device; managing the Flash memory array 212 and updating RAM control registers and tables 214. The Flash memory array 212 contains a sequence of erase blocks 216, 226 arranged in paired sets of erase blocks. Each erase block 216, 226 contains a series of sectors 218, 234 that contain a user data space 220, 230 and a control/overhead data space 222, 232. The overhead data space 222, 232 contains overhead information for operation of the sector 218, 234, such as an error correction code (not shown), status flags, or an erase block management data field area (not shown). The RAM control registers and tables 214 are loaded at power up from the non-volatile erase block management registers and tables 228 by the control state machine 210. The user data space 220 in each sector 218 is typically 512 bytes long. In a Flash memory device 200 embodiment of the present invention each erase block 216 typically contains 128 sectors 218. It is noted that other formats for the erase blocks 216, 226 and sectors 218, 234 are possible and should be apparent to those skilled in the art with benefit of the present disclosure.

Figure 2B:
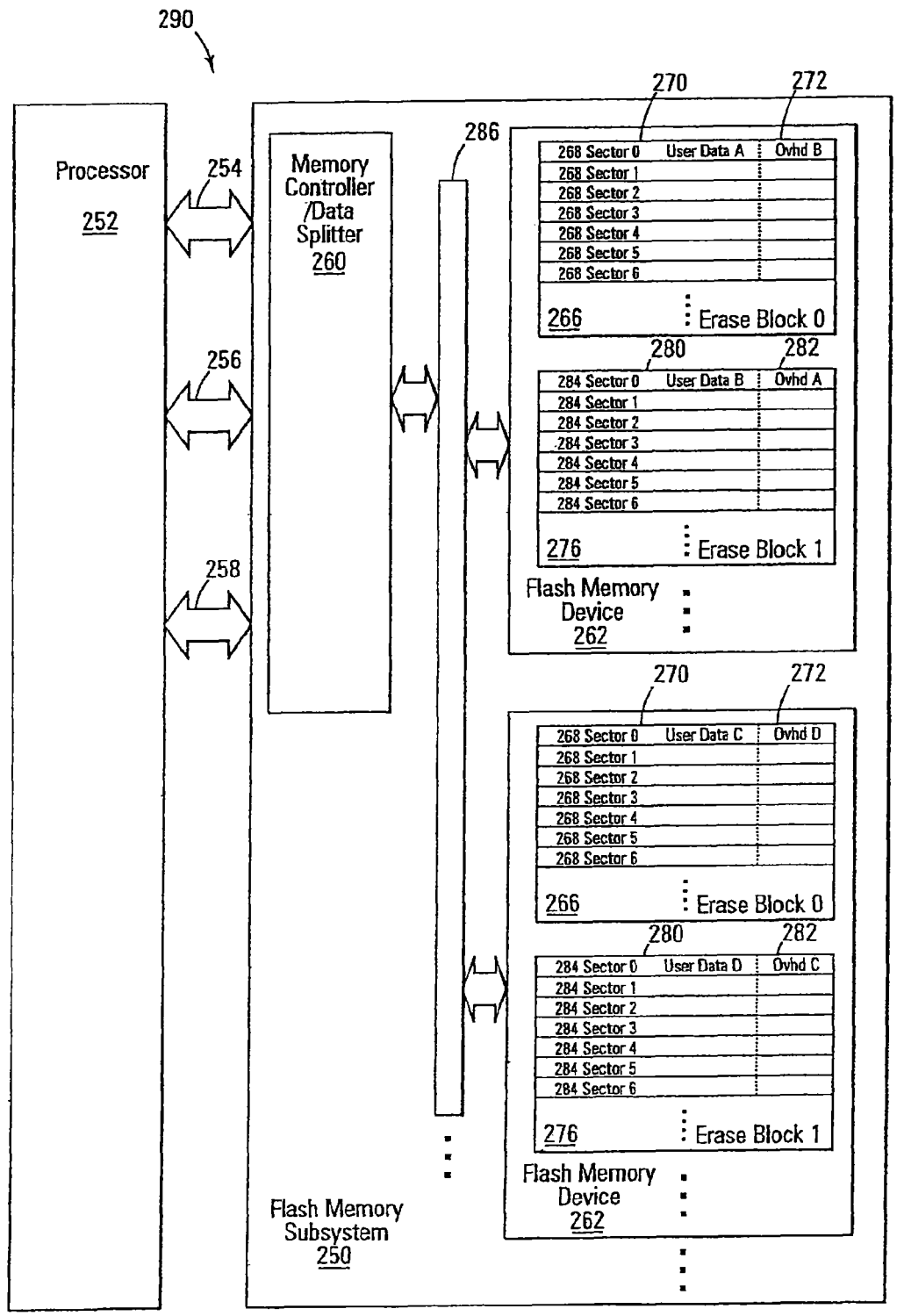

FIG. 2B is a simplified diagram of another computer system 290 that incorporates a Flash memory system 250 embodiment of the present invention. In the computer system 290 of FIG. 2B, the Flash memory system 250, such as a memory system or Flash memory card, is coupled to a processor 252 with an address 254, control 256, and data bus 258. Internal to the Flash memory system 250, a memory controller 260 directs internal operation of the Flash memory system 250; managing the Flash memory devices 262, directing data accesses, updating internal control registers and tables (not shown), and/or directing operation of other possible hardware systems (not shown) of the Flash memory system 250, such as a hardware data splitter. The memory controller 260 is coupled to and controls one or more Flash memory devices 262 via an internal control bus 286. It is noted that other architectures Flash memory systems 250, external interfaces 254, 256, 258, and manners of coupling the memory controller 260 to the Flash memory devices 262, such as directly coupled individual control busses and signal lines, are possible and should be apparent to those skilled in the art with benefit of the present disclosure.

The Flash memory devices 262 contain a sequence of erase blocks 266, 276 in internal memory arrays. Each erase block 266, 276 contains a series of sectors 268, 284 that contain a user data space 270, 280 and a control/overhead data space 272, 282. The overhead data space 272, 282 contains overhead information for operation of the sector 268, 284, such as an error correction code (not shown), status flags, or an erase block management data field area (not shown). In a Flash memory system 250 embodiment of the present invention each Flash memory device 262 has their erase blocks 266, 276 internally arranged in paired sets of erase blocks (superblocks). In another Flash memory system 250 embodiment of the present invention paired sets of erase blocks 266, 276 (superblocks) are arranged across two or more Flash memory devices 262. It is noted that other formats and pairings for Flash memory devices 262, erase blocks 266, and sectors 268 are possible and should be apparent to those skilled in the art with benefit of the present disclosure.

Figure 3:
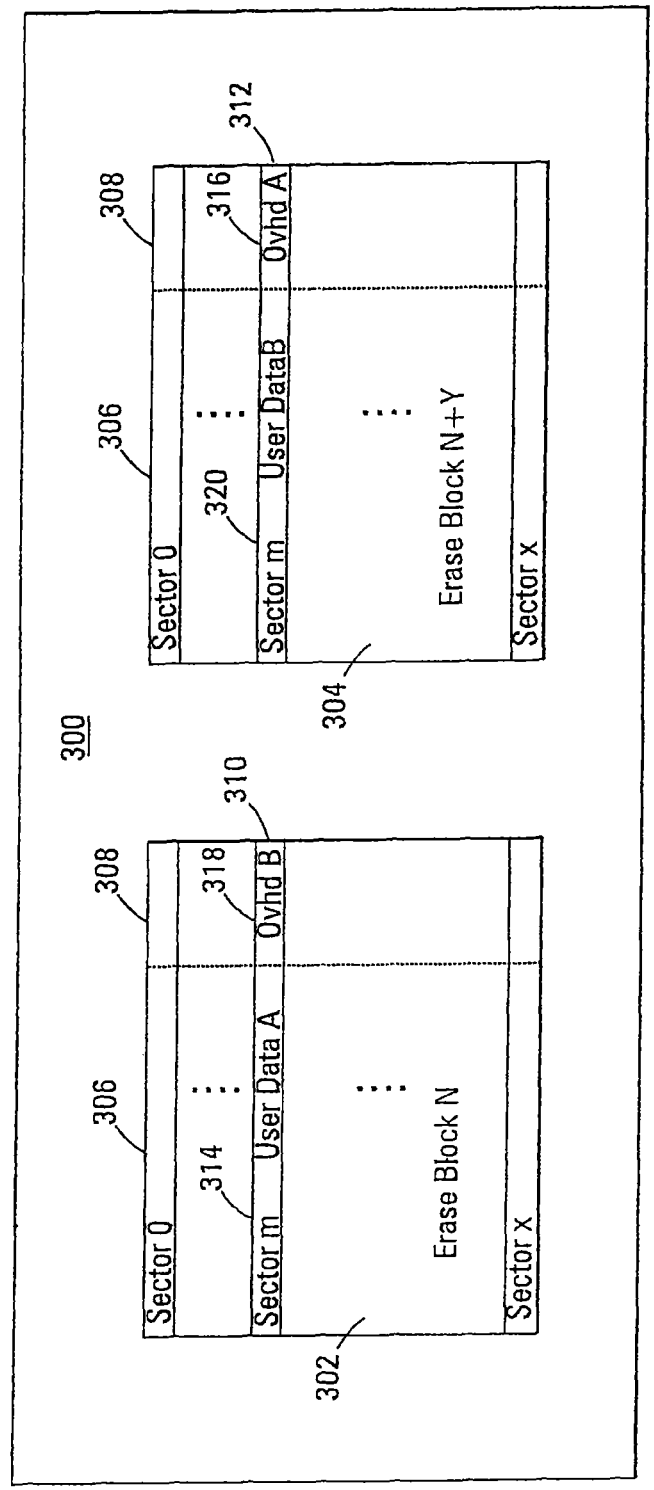
FIG. 3 details an erase block super block pair of a Flash memory in accordance with an embodiment of the present invention.

FIG. 3 further details an example of a super block 300 of one possible sector format for a Flash memory embodiment of the present invention. In FIG. 3, a pair of erase blocks (Erase Block N and Erase Block N+Y, where typically Y is an offset, and all user accessible erase blocks of the Flash memory array are paired) 302, 304 are paired together into a super block 300. Each erase block 302, 304 of the super block pair 300 has sectors 0 through x for x+1 total sectors in each erase block 302, 304. Each sector having a user data area 306 and an overhead data area 308.

When user data 306 is written to a selected sector m 310, 312 of an erase block 302, 304 of the super block 300, the overhead data generated for the user data is written into the overhead data area 306 of another selected sector m 310, 312 of the other erase block 302, 304 of the erase block super block pair 300. For example, User Data A written to the user data area 314 of Sector m 310 of Erase Block N 302 will have its Overhead Data (Ovhd A) written to the overhead data area 316 of Sector m 312 of Erase Block N+Y 304; User Data B written to the user data area 320 of Sector m 312 of Erase Block N+Y 304 will have its Overhead Data (Ovhd B) written to the overhead data area 318 of Sector m 310 of Erase Block N 302.

When user data 306 is read from a selected sector m 310, 312 of an erase block 302, 304 of the super block 300, the overhead data for the user data is read from the overhead data area 308 of another selected sector m 310, 312 of the other erase block 302, 308 of the erase block pair 300. For example, User Data A read from the user data area 314 of Sector m 310 of Erase Block N 302 will have its Overhead Data (Ovhd A) read from the overhead data area 316 of Sector m 312 of Erase Block N+Y 304; User Data B read from the user data area 320 of Sector m 312 of Erase Block N+Y 304 will have its Overhead Data (Ovhd B) read from the overhead data area 318 of Sector m 310 of Erase Block N 302.

It is noted that the relative addresses of the erase blocks 302, 304 that make up the super block pair 300 (Erase Block N 302 and Erase Block N+Y 304) within a Flash memory are arbitrary and can be selected to gain the most architectural advantage for the Flash memory. It is also noted that the relative address of the selected sector m 310, 312 that contains user data to the relative address of the other sector m of the associated erase block 302, 304 of the super block 300 pair that contains the associated overhead data for the user data is also arbitrary and has multiple possible methods of mapping. These methods include, but are not limited to, using the same sector address in both associated erase blocks 302, 304 of the super block pair 300, using a sector address m for user data and sector address x−m for overhead data, or using sector address m for user data and sector address m+1 for overhead data. It is noted that other arrangements for writing and reading split user 306 and associated overhead 308 data from two separate sectors 310, 312 each from separate associated erase blocks 302, 304 of a super block pair 300 are possible and should be apparent to those skilled in the art with benefit of the present disclosure.

In the Flash memory embodiment of the present invention detailed in FIG. 2A, when user data is written to a sector 218, 234 of an erase block 216, 226 of the Flash memory 200, the overhead data generated for the user data is written into the overhead data area 222, 232 of a sector 218, 234 of the associated erase block 216, 226 of the erase block super block pair. For example, User Data A written to the user data area 220 of Sector 0 218 of Erase Block 0 216 will have its Overhead Data (Ovhd A) written to the overhead data area 232 of Sector 0 234 of Erase Block 1 226; User Data B written to the user data area 230 of Sector 0 228 of Erase Block 1 226 will have its Overhead Data (Ovhd B) written to the overhead data area 222 of Sector 0 218 of Erase Block 0 216.

When user data is read from a sector of an erase block of the Flash memory 200, the overhead data for the user data is read from the overhead data area of a sector of the associated erase block of the erase block super block pair. For example, User Data A read from the user data area 220 of Sector 0 218 of Erase Block 0 216 will have its Overhead Data (Ovhd A) read from the overhead data area 232 of Sector 0 234 of Erase Block 1 226; User Data B read from the user data area 230 of Sector 0 228 of Erase Block 1 226 will have its Overhead Data (Ovhd B) read from the overhead data area 222 of Sector 0 218 of Erase Block 0 216.

Dedicated data splitting circuitry 224 is utilized in one Flash memory 200 embodiment of the present invention to automate the split of the user data and overhead data and to improve the operation of writing or reading the split user/overhead data from each erase block super block pair of the Flash memory array 212. This dedicated data splitting hardware 224 eliminates the need for these operations to be handled by the control state machine/firmware 210 and thus reduces the access time penalty of splitting the user data and overhead data. The erase blocks 216, 226 of the Flash memory 200 are erased and allocated in pairs by the control state machine/firmware 210. Erase block erasure of Flash memory 200 embodiments of the present invention also are generally done under control of the control state machine/firmware 210, as the operation is infrequent and of a relatively long duration, reducing its time criticality.

FIG. 4A is a simplified diagram of a super block pair 400 showing one method of data write/read access sequences to an embodiment of the present invention. In FIG. 4A, the super block 400 contains a paired set of associated erase blocks (Erase Block N and Erase Block N+Y) 402, 404. Each erase block 402, 404 containing a sequence of erase block sectors 414 having a user data area 406, 410 and an overhead data area 408, 412.

When data is written to/read from the associated erase blocks 402, 404 of the super block 400 of FIG. 4A, each sector of data is sequentially written to/read from the associated erase blocks 402, 404 of the super block 400 in a manner that alternates accesses to each erase block 402, 404. Thus, the next sector 414 to be written/read in the super block 400 of FIG. 4A is selected from the erase block 402, 404 that was not last written/read. For example, 2 kilobytes of data (alternatively, 4 sectors of data) written to the super block pair 400 of FIG. 4A starting on an even erase block address is written/read in the order (sequence 1, 2, 3, 4, 5, 6, 7, and 8) 416 as shown. In FIG. 4A, the first sequential sector of user data is written or read from the super block 400 starting with the user data area 406 of Sector 0 of Erase Block N 402. The overhead data area 412 of Sector 0 of Erase Block N+Y 404 is then written/read for the overhead data associated with the first sequential sector of user data. The second sequential sector (the next sector) of user data written to/read from the super block 400 is then written to/read from the user data area 410 of Sector 0 of Erase Block N+Y 404 and the associated overhead data is written to/read from the Sector 0 overhead data area 408 of Erase Block N 402. The third sequential sector of user data written to/read from the super block 400 is written to/read from the user data area 406 of Sector 1 of Erase Block N 402 and the associated overhead data is written to/read from the Sector 1 overhead data area 412 of Erase Block N+Y 404. The fourth sequential sector (the final 512 byte sector of the 2 kilobytes of user data) of user data written to/read from the super block 400 is then written to/read from the user data area 410 of Sector 1 of Erase Block N+Y 404 and the associated overhead data is written to/read from the Sector 1 overhead data area 408 of Erase Block N 402.

For 2 kilobytes of data (alternatively, 4 sectors of data) written to the super block pair 400 of FIG. 4A starting on an odd erase block address, the user data is written/read in the example order (second sequence 1, 2, 3, 4, 5, 6, 7, and 8) 418 as shown, starting at sector address 3. In FIG. 4A, the first sequential sector of user data is written or read from the super block 400 starting with the user data area 410 of Sector 3 of Erase Block N+Y 404. The overhead data area 408 of Sector 3 of Erase Block N 402 is then written/read for the overhead data associated with the first sequential sector of user data. The second sequential sector (the next sector) of user data written to/read from the super block 400 is then written to/read from the user data area 406 of Sector 4 of Erase Block N 402 and the associated overhead data is written to/read from the Sector 4 overhead data area 412 of Erase Block N+Y 404. The third sequential sector of user data written to/read from the super block 400 is written to/read from the user data area 410 of Sector 4 of Erase Block N+Y 404 and the associated overhead data is written to/read from the Sector 4 overhead data area 408 of Erase Block N 402. The fourth sequential sector (the final 512 byte sector of the 2 kilobytes of user data) of user data written to/read from the super block 400 is then written to/read from the user data area 406 of Sector 5 of Erase Block N 402 and the associated overhead data is written to/read from the Sector 5 overhead data area 412 of Erase Block N+Y 404.

FIG. 4B is a simplified diagram of a super block pair 450 showing another method of data write/read access sequences to an embodiment of the present invention. In FIG. 4B, the super block 450 contains a paired set of associated erase blocks (Erase Block N and Erase Block N+Y) 452, 454. Each erase block 452, 454 containing a sequence of erase block sectors 464 having a user data area 456, 460 and an overhead data area 458, 462.

When data is written to/read from the associated erase blocks 452, 454 of the super block 450 of FIG. 4B, each sector of data is sequentially written to/read from an erase block 452, 454 in a sequential manner and the overhead data placed in the overhead data area 458, 462 of the other associated erase block 452, 454 of the super block pair 450. Once the selected erase block 452, 454 of the super block pair 450 is entirely filled/read, user data is written to/read from the other associated erase block 452, 454 of the super block pair 450 and the overhead data is stored in the overhead data areas 458, 462 of the first erase block 452, 454.

For example, user data is written to/read from the super block pair 450 of FIG. 4B in the order (sequence 1, 2, 3, and 4; A, B, C, and D) 466 as shown. In FIG. 4B, the first sequential sector of user data is written or read from the super block 400 starting with the user data area 456 of Sector 0 of Erase Block N 452 (for write/read sequence 1, 2, 3, and 4). The overhead data associated with the first sequential sector of user data is then written to/read from the overhead data area 462 of Sector 0 of Erase Block N+Y 454. The second sequential sector (the next sector) of user data written to/read from the super block 450 is then written to/read from the user data area 456 of the next sequential sector 464 (Sector 1) of Erase Block N 452 and the associated overhead data is written to/read from the next sequential sector (Sector 1) overhead data area 462 of Erase Block N+Y 454. User data and associated overhead data is written to/read from the erase blocks 452, 454 of super block 450 in this manner until all the user data areas 406 of the sectors 464 of Erase Block N 452 have been utilized or all its utilized sectors 464 read.

User data is placed into/read from the user data areas 460 of Erase Block N+Y 454 of the super block pair 450 in a similar manner; placing user data in the user data area of sector 464 of Erase Block N+Y 454 and the associated overhead data in a sector 464 overhead area 458 of Erase Block N 452 (for write/read sequence A, B, C, and D). In FIG. 4B, the first sequential sector of user data is written or read from the super block 400 starting with the user data area 460 of Sector 0 of Erase Block N+Y 454. The overhead data associated with the first sequential sector of user data is then written to/read from the overhead data area 458 of Sector 0 of Erase Block N 452. The second sequential sector (the next sector) of user data written to/read from the super block 450 is then written to/read from the user data area 410 of the next sequential sector 464, Sector 1, of Erase Block N+Y 454 and the associated overhead data is written to/read from the next sequential sector 464, Sector 1, overhead data area 458 of Erase Block N 452. User data and associated overhead data is written to/read from the erase blocks 452, 454 of super block 450 in this manner until all the user data areas 460 of the sectors 464 of Erase Block N+Y 454 have been utilized or all utilized sectors 464 read.

FIG. 4C is a simplified diagram of a super block pair 470 showing yet another method of data write/read access sequences to an embodiment of the present invention. In FIG. 4C, the super block 470 contains a paired set of associated erase blocks (Erase Block N and Erase Block N+Y) 472, 474. Each erase block 472, 474 containing a sequence of erase block sectors 484 having a user data area 476, 480 and an overhead data area 478, 482.

When data is written to/read from the associated erase blocks 472, 474 of the super block 470 of FIG. 4C, each sector of data is sequentially written to/read from the associated erase blocks 472, 474 of the super block 470 in a manner that alternates accesses to each erase block 472, 474, similar in manner to the method of FIG. 4A. Thus, the next sector 484 to be written/read in the super block 470 of FIG. 4C is selected from the erase block 472, 474 that was not last written/read. However, the overhead data of the previous sector is always written to/read from the following sector so that the sector accesses are sequential and thus efficient, particularly for large sections of data.

For example, user and overhead data is written to/read from the super block pair 470 of FIG. 4C in the sequence 486 (user data A, user data B, overhead A, user data C, overhead B, user data D, overhead C, user data E, overhead D, user data F, overhead E, . . . , user data M, overhead K, user data N, overhead M, user data O, overhead N, user data P, overhead O, and wrapping around to overhead P in Sector 0) as shown. In FIG. 4C, the first sequential sector of user data (A) is written or read from the super block 470 starting with the user data area 476 of Sector 0 of Erase Block N 472, the overhead data of Sector 0 is not accessed at this time. The second sequential sector (the next sector) of user data (B) written to/read from the super block 470 is then written to/read from the user data area 480 of Sector 0 of Erase Block N+Y 474. At the same time the overhead data area 482 of the second sequential sector (the next sector) (Sector 0 of Erase Block N+Y 474) is then simultaneously written to/read from for the overhead data (o/h A) associated with the first sequential sector of user data (A). The third sequential sector of user data (C) written to/read from the super block 470 is written to/read from the user data area 476 of Sector 1 of Erase Block N 472 while the associated overhead data (o/h B) of the second sequential sector is simultaneously written to/read from its overhead data area 478. The fourth sequential sector of user data (D) written to/read from the super block 470 is then written to/read from the user data area 480 of Sector 1 of Erase Block N+Y 474 while the associated overhead data (o/h C) of the second sequential sector is simultaneously written to/read from its overhead data area 478. User data and associated overhead data is simultaneously written to/ read from the sectors 484 of erase blocks 472, 474 of super block 470 in this manner until all the user data areas 476, 480 of the superblock 470 have been utilized or all utilized sectors 484 are read. Upon reaching the final sector 484 of Erase Block N+Y 474, the final sector user data (P) is written to/read from the user data area 480 and the associated overhead data for the previous sector (o/h O) is written to/read from the overhead data area 482. The method of FIG. 4C then wraps around and writes/reads the associated overhead data (o/h P) for the final sector 484 of Erase Block N+Y 474 from the overhead data area 478 of Sector 0 of Erase Block N 472. In the method of FIG. 4C, the total number of write or read operations to write/read a sequential number of sectors from the superblock 470 is the total number of sectors to be accessed plus one additional operation to write/read the overhead data of the final sector accessed and not the two times the total number of sectors accessed that other methods require.

Figure 4D:
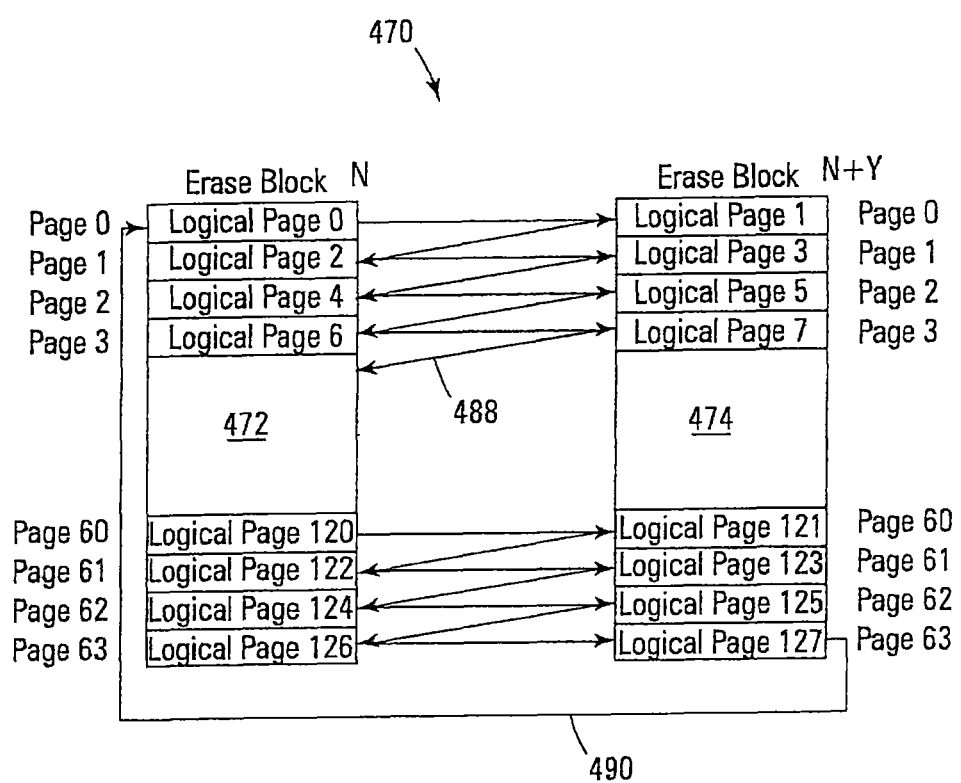

FIG. 4D is another simplified diagram of a super block pair 470 detailing the data access sequence flow of writes/reads of the method of FIG. 4C. In FIG. 4D, the super block 470 contains a paired set of associated erase blocks (Erase Block N and Erase Block N+Y) 472, 474. Each erase block 472, 474 containing a sequence of 64 erase block sectors/logical column pages having a user data area and an overhead data area. Each erase block sector/logical page can contain one or more logical sectors. The data access is shown sequentially alternating 488 between the erase blocks 472, 474 as a data access increments during a read/write sequence to the super block pair 470. When the final erase block sector of the super block pair 470 is accessed, the method wraps around to access the overhead data from the first erase block 472. This allows the data splitting write/read access method of FIGS. 4C and 4D to access the data contained in the paired erase blocks 472, 474 of the super block 470 with only a single additional access over what would be required over accessing the data in a pair of erase blocks in a non-data split Flash memory.

Figure 5:
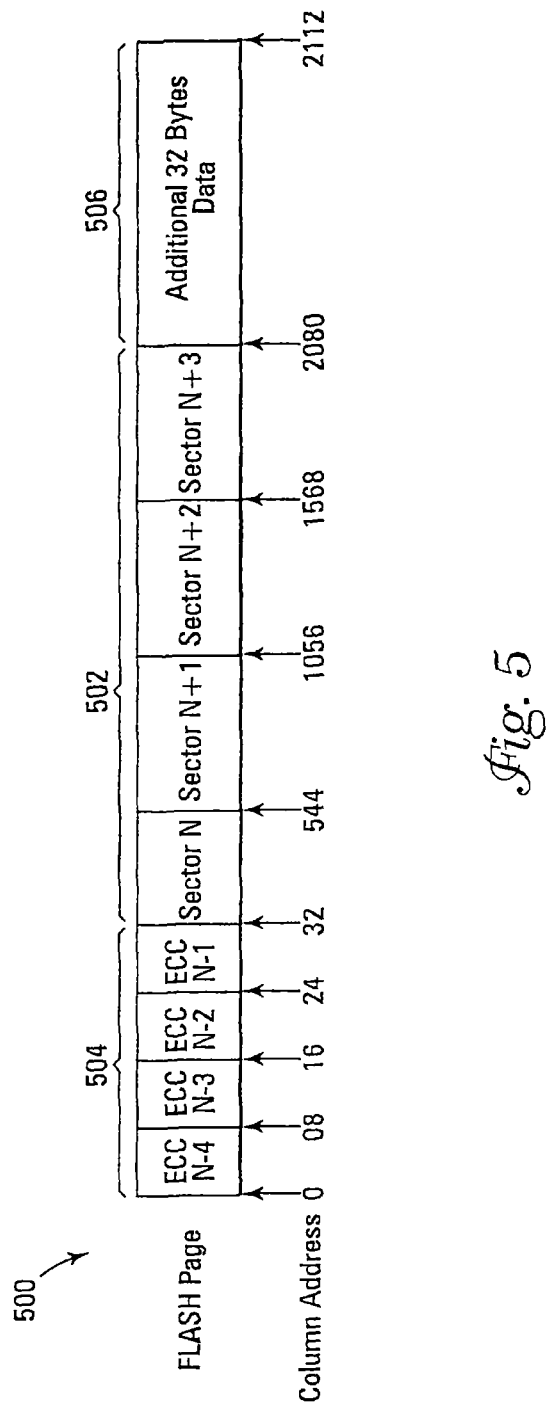
FIG. 5 details a NAND Flash erase block sector of an embodiment of the present invention.

As stated above, many Flash memories support multiple logical sectors or data words within a single physical column page sector (also known as the physical sector), in particular NAND architecture Flash memories typically utilize this approach due to their generally higher memory cell density and larger column page sizes. FIG. 5 details an example of a Flash memory column page sector 500 of a Flash memory device array of an embodiment of the present invention. The physical column page sector 500 of FIG. 5 contains 2112 bytes of data and is formatted to contain four 512-byte logical sectors 502. In addition, space is provided at the beginning of the physical column page sector 500 for four ECC codes 504 of 8 bytes each. A further 32 bytes 506 is reserved for use by the EBM firmware or other system level usage. The four 512-byte logical sectors 502 are sequentially addressed N, N+1, N+2, and N+3, where N is a base logical sector address for the physical column page sector 500. The ECC codes 504 of the physical column page sector 500 are sequentially addressed N−4, N−3, N−2, and N−1 to allow them to store the ECC codes for the four sectors of the previously addressed physical column page sector (not shown). This allows the physical column page sector 500 to be utilized in implementing the data write/read access of the method of FIGS. 4C and 4D. It is noted that other physical column page sector formats of differing data sizes, numbers of logical sectors/data words, and split data write/read access methods/patterns are possible and should be apparent to those skilled in the art with the benefit of the present disclosure.

Figure 6A:
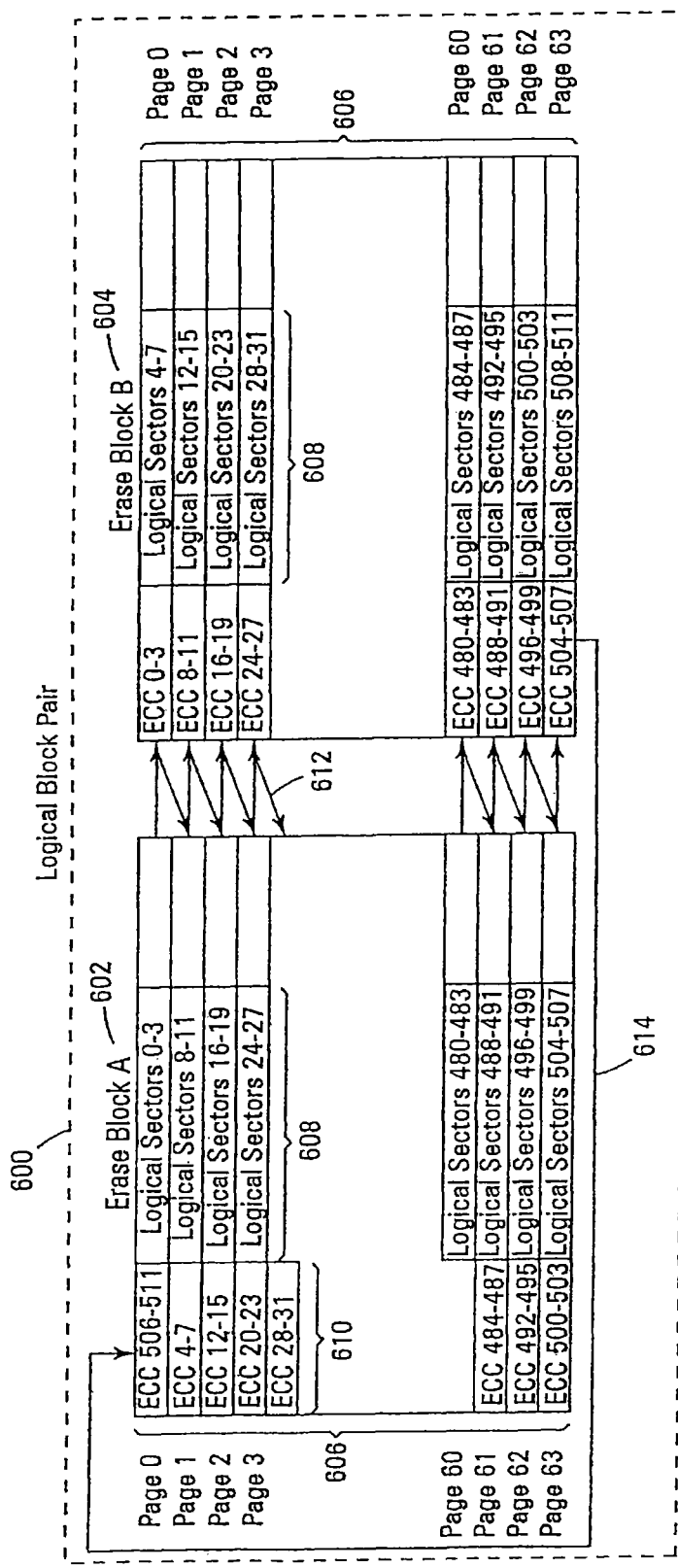
FIGS. 6A and 6B detail sector write/read order of an erase block super block of a NAND architecture Flash memory in accordance with an embodiment of the present invention.
Figure 6B:
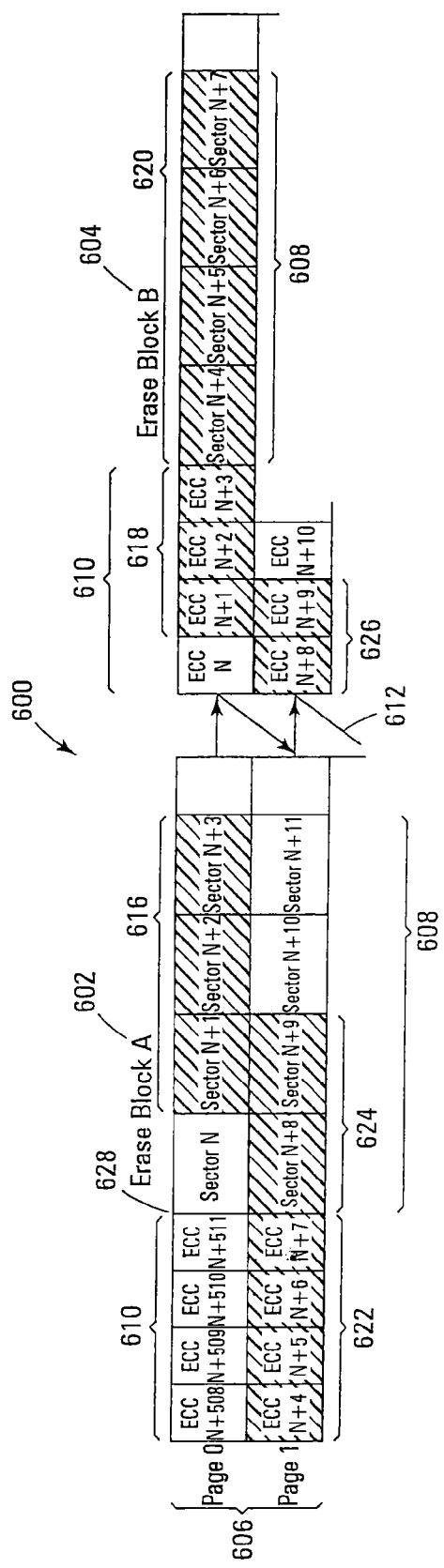

FIGS. 6A and 6B are simplified diagrams of a super block pair 600 showing the sequence flow of the data write/read access of the method of FIGS. 4C and 4D utilizing a multi-logical sector format of a physical column page sector, as shown in FIG. 5. In FIG. 6A, a superblock 600 contains a pair of matched erase blocks (Erase Block A and Erase Block B) 602, 604. Each erase block 602, 604 contains 64 physical column page sectors 606 of four logical sectors 608 each. The 128 total physical column page sectors 606 are written to/read from in the manner detailed in FIGS. 4C and 4D. Each of the physical column page sectors 606 also contains four ECC codes 410 that correspond to the four logical sectors 608 of the previous physical column page sectors 606. The data access is shown sequentially alternating 612 between the physical column page sectors 606 of the erase blocks 602, 604 as a data access increments during a read/write sequence to the super block pair 600. Within a physical column page sector 606 data accesses are sequentially incremented from logical sector 608 to logical sector 608 until all have been accessed. When the next physical column page sector 606 is accessed the ECC data 610 for the logical sectors 608 of the previous physical column page sector 606 is accessed. When the final physical column page sector 606 of the super block pair 600 is accessed (from Erase Block B) and all the contained logical sectors 608 accessed, the data access method wraps around 614 to access the associated ECC/overhead data 610 for the logical sectors from the first physical column page sector 606 of the first erase block (Erase Block A) 602.

In FIG. 6B, a simplified diagram showing the sequence flow of the data write/read access in a multi-logical sector format of a physical column page sector wherein the data access does not start and end on a physical column page boundary utilizing the method of FIGS. 4C and 4D. In FIG. 6B, the addresses of the logical sectors start from a base address N that corresponds to the first logical sector 628 of physical sector 0 of Erase Block A 602. A data access starts on logical sector address N+1 of physical sector 0 of Erase Block A 602 and accesses logical sectors N+1, N+2, and N+3 616 of physical sector 0 of Erase Block A 602. The data access continues in physical sector 0 of Erase Block B 604 and accesses ECC N+1, ECC N+2, and ECC N+3 618 and the logical sectors N+4, N+5, N+6, and N+7 620. The ECC data for ECC N+4, ECC N+5, ECC N+6, and ECC N+7 622 are accessed from physical sector 1 of Erase Block A 602 along with the logical sectors N+8 and N+9 624. The data access is then finished by accessing the ECC data for logical sectors N+8 and N+9 624, ECC N+8 and ECC N+9 626 from physical sector 1 of Erase Block B 604.

It is noted that other manners of accessing a multi-logical sector format of a physical sector utilizing embodiments of the present invention should be apparent to those skilled in the art with the benefit of the present disclosure.

Figure 7:
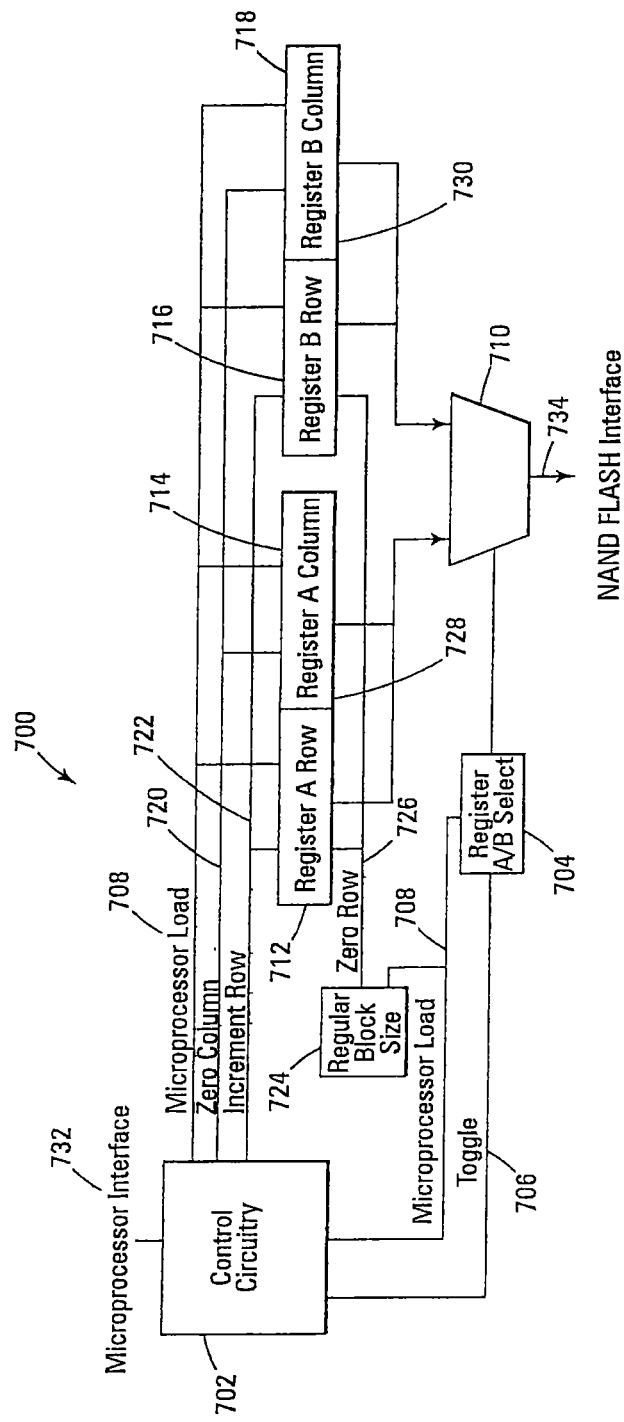
FIG. 7 details a data splitting control circuit in accordance with an embodiment of the present invention.

FIG. 7, details a simplified diagram of an address control circuit 700 of a Flash memory embodiment of the present invention. The address control circuit allows for automatic generation of sequential addresses given a starting address loaded into it by a processor or a memory controller, simplifying memory system address control in a data splitting memory or memory system. In FIG. 7, two address registers 728, 730 contain the addresses for accessing an Erase Block A and Erase Block B of a superblock pair (not shown). Each address register 728, 730 contain a row address register 712, 716 and a column address register 714, 718. The address registers 728, 730 are coupled to an address multiplexer 710 that selectively couples each address register 728, 730 to the interface 734 of a Flash memory subsystem, card, or individual Flash memory device (not shown). A register select circuit 704 is coupled to the address multiplexer 710 and controls its operation. An erase block size control circuit 724 is coupled to the row address registers 712, 716 and resets all or part of the row address registers 712, 716 to control wrap around within the superblock to wrap access around to the first physical sector/column page of the superblock (the first physical sector of the first erase block, Erase Block A) after the final physical sector (the final physical sector of the second erase block, Erase Block B) has been accessed. A control circuit 702 is coupled to a host interface (typically a processor or a memory controller) 732 and to the address registers 728, 730 by a Load 708, Increment Row 722, and Zero Column 720 signal lines that allow the control circuit 702 to load the address registers 728, 730 with an address, increment the row address registers 712, 716, and zero the column address registers 714, 718. The Load 708 signal line is also coupled to the erase block size control circuit 724, allowing the control circuit to load an initial count into the erase block size control circuit 724. Both the Load 708 and a Toggle 706 signal lines are coupled to the register select circuit 704, allowing the register select circuit 704 to be loaded with an initial selected erase block of the superblock pair and allowing the control circuit 702 to toggle the selected erase block address from the address registers 728, 730 that is coupled to the Flash memory.

In operation of the address control circuit 700 of FIG. 7, the control circuit 702 loads an initial access address, which may or may not contain an initial address offset in the selected column page (typically reflected in a non-zero column address), from a coupled host (not shown) to the address registers 728, 730 and the erase block size control circuit 724. The host accesses the coupled Flash memory/Flash memory subsystem, which operates in a burst access mode, automatically incrementing the internally latched address for each read/write access. It is noted that the control circuit 702 may be adapted to operate the coupled Flash memory in the absence of a usable burst mode of operation. The control circuit 702 tracks the number of accesses until the column page boundary of the current column page/physical sector of the selected erase block of the super block pair is reached (the highest addressed data word/logical sector of the current column page is reached). At the end of a column page/physical sector the register select circuit 704 is toggled by the control circuit 702 to begin access in the next column page from the other erase block. The control circuit 702 increments the row registers 712, 716, in addition to toggling the register select circuit 704, when the column page boundary reached is the column page boundary of the second erase block (Erase Block B). This wraps around the access to the beginning of the next row of the superblock (the next row of the first erase block, Erase Block A). If the currently selected column page being accessed is the initial column page of the data access, the control circuit 702 resets all or part of the column address registers 714, 718 to zero to eliminate the initial address offset within the column page, when the column page boundary is reached. This initial address offset is loaded with the initial address from the host and is no longer needed after the first column page; if access continues, the next address will start in the next sequential column page/physical sector at zero (the lowest addressed data word/logical sector in the column page). Alternatively, the control circuit can automatically reset the column page registers 714, 718 to zero upon each column page boundary being reached. It is noted that multiple Flash erase block addressing schemes are possible necessitating setting/resetting all or only a portion of the column address to zero after the initial page boundary (i.e., where the column page size does not match the size of the erase blocks of the Flash memory device). It is also noted that in Flash erase block addressing schemes where the column page size does not match the size of the erase blocks of the Flash memory device, the column address and row address registers may need to be incremented in a different manner than simply incrementing the row address registers to address the next column pages of the erase blocks of the superblock.

If the data access is at end of superblock (the last physical sector of the second erase block, Erase Block B) erase block size control circuit 724 notes the final access (by the value of an internal register loaded by the initial address provided by the host) and resets the row address registers to zero to wrap around the data access (to the first physical sector/column page of the first erase block, Erase Block A). This wrap around allows the data access to continue from the beginning of the superblock or simply allow for the access of the ECC data for the last physical sector of the superblock (last physical sector/column page of Erase Block B).

This design takes advantage of the structure of the Flash memory column page/physical sector addressing to generate the alternating erase block addresses required by data splitting and offloads this task from the memory controller/processor (host). The main interaction required by the host is the loading of the controller circuit 700 with the initial address of the data access. It is noted that this controller circuit 700 can be adapted to operate with Flash memory devices having differing addressing schemes, erase block sizes, physical sector sizes/formats, and burst or non-burst access modes and should be apparent to those skilled in the art with the benefit of the present invention.

Figure 8A:
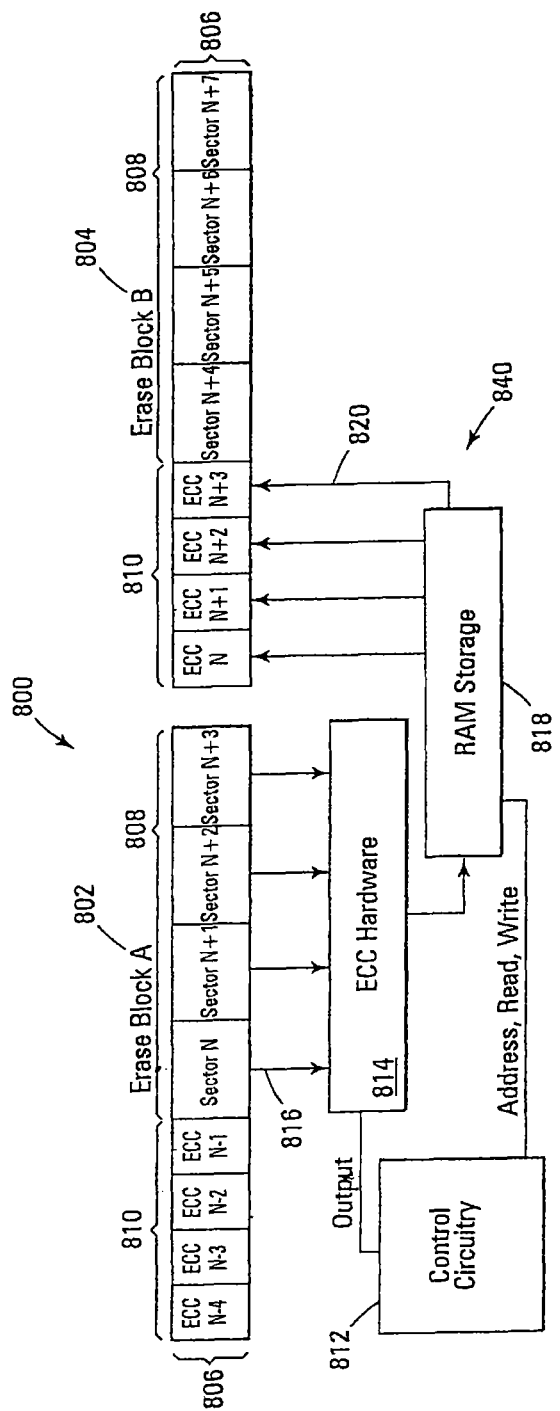
FIGS. 8A and 8B detail a split data ECC circuit in accordance with an embodiment of the present invention.
Figure 8B:
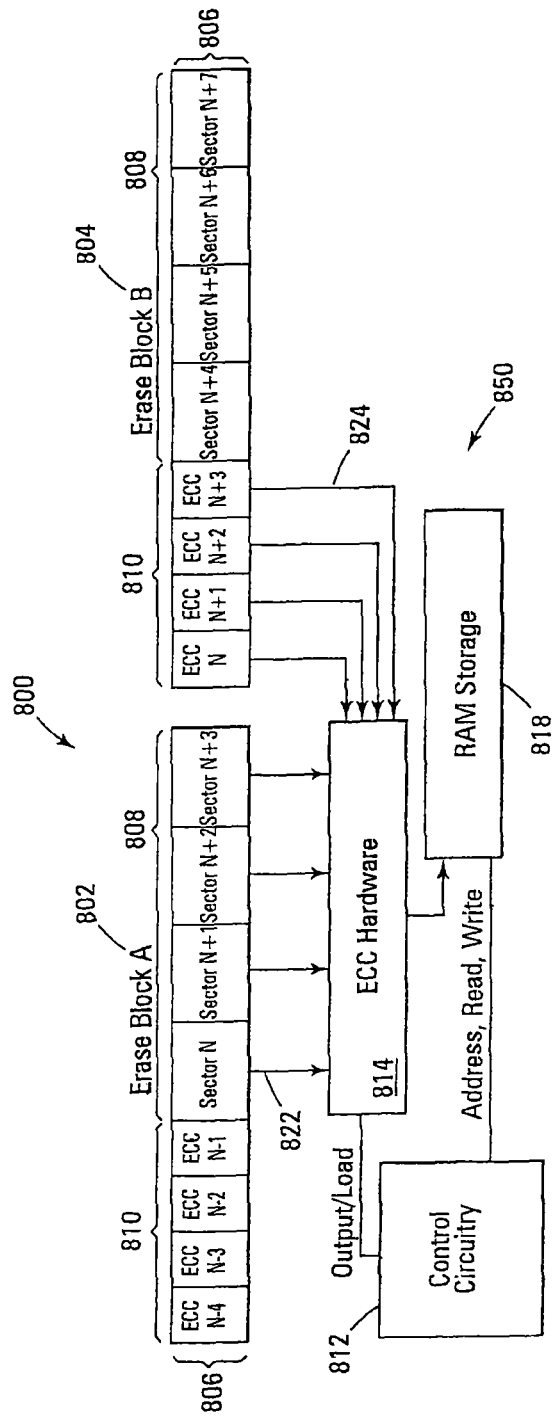

FIGS. 8A and 8B detail simplified diagrams of a split data ECC circuit of an embodiment of the present invention for both a read 850 and a write 840 access. In FIGS. 8A and 8B, a split data ECC circuit 800 is shown in a write operation 840 and a read operation 850 on two physical sectors 806 of erase blocks (Erase Block A 802 and Erase Block B 804) of a superblock for the data write/read access method discussed in FIGS. 4C and 4D utilizing the physical sector format of FIG. 5. The column page/physical sectors 806 of the erase block 802, 804 contain four logical sectors 808 and four ECC data codes 810 each. The four logical sectors 808 of each erase block physical sector 806 are sequentially addressed; N, N+1, N+2, and N+3 for the detailed physical sector 806 of Erase Block A 802, and N+4, N+5, N+6, and N+7 for the detailed physical sector 806 of Erase Block B 804, where N is a base address. The four ECC codes 810 of each erase block physical sector 806 are also sequentially addressed and store the ECC codes for the four sectors of the previously addressed physical sector/column page 806; ECC N−4, N−3, N−2, and N−1 for the detailed physical sector 806 of Erase Block A 802, and ECC N, N+1, N+2, and N+3 for the detailed physical sector 806 of Erase Block B 804.

In FIG. 8A, ECC circuit/hardware 814 under direction of control circuit 812 is coupled to the sector data being written to the currently write accessed physical sector (in FIG. 8A, the logical sectors N, N+1, N+2, and N+3 808 of the detailed physical sector 806 of Erase Block A 802), during or after the logical sector write access. The ECC hardware 814 generates the required ECC data for the user data written into the logical sectors of the write accessed physical sector 806 and writes them to a RAM storage circuit 818. When the next sequentially addressed physical sector 806 is write accessed the control circuit 812 writes out 820 the stored ECC data into the ECC code area 810 of the next sequentially addressed physical sector 806 (in FIG. 8A, the ECC code areas N, N+1, N+2, and N+3 810 of the detailed physical sector 806 of Erase Block B 804). This ECC generate, store, write process is repeated by the split data ECC circuit 800 for each next sequentially write accessed physical sector 806 of the Flash memory/superblock.

In FIG. 8B, ECC circuit/hardware 814 under direction of control circuit 812 is coupled to read 816 the sector data being read from the currently read accessed physical sector (in FIG. 8B, the logical sectors N, N+1, N+2, and N+3 808 of the detailed physical sector 806 of Erase Block A 802). The ECC hardware 814 generates the ECC data for the user data read from the logical sectors of the read accessed physical sector 806 and temporarily writes it to a RAM storage circuit 818. Before reading the next sector, the ECC hardware 814 is loaded with the ECC data stored in the RAM 818. Then when the next sequentially addressed physical sector 806 is read accessed the control circuit 812 directs the ECC hardware 814 to read 824 the stored ECC data from the ECC code area 810 of the next sequentially addressed physical sector 806 (in FIG. 8B, the ECC code areas N, N+1, N+2, and N+3 810 of the detailed physical sector 806 of Erase Block B 804) and completes the ECC check for data errors. In one embodiment of the invention, the ECC hardware will also attempt to correct the detected data errors before the read user data is transferred from the Flash memory. This ECC generate, store, compare ECC data, and/or correct process is repeated by the split data ECC circuit 800 for each next sequentially read accessed physical sector 806 of the Flash memory/superblock.

It is noted that other manners of writing and reading ECC data in split data single and multi-logical sector format physical sector Flash memories utilizing embodiments of the present invention should be apparent to those skilled in the art with the benefit of the present disclosure.

It is also noted that other data write/read access sequences and circuits for data splitting in embodiments of the present invention are possible and should be apparent to those skilled in the art with benefit of the present disclosure.

CONCLUSION

Improved Flash memory device, system, and data handling routine have been detailed with a distributed erase block sector user/overhead data scheme that splits the user data and overhead data and stores them in differing associated erase blocks. The erase blocks of the improved Flash memory are arranged into associated erase block pairs in "super blocks" such that when user data is written to/read from the user data area of a sector of an erase block of the super block pair, the overhead data is written to/read from the overhead data area of a sector of the other associated erase block of the super block pair. This data splitting enhances fault tolerance and reliability of the improved Flash memory device. Additionally, the performance cost of data splitting is minimized by the utilization of dedicated data splitting circuitry to automate the reading and writing of user data and its associated overhead data into differing erase blocks of an erase block super block pair. Furthermore, a method of partitioning data is shown for efficiently writing data in a distributed user/overhead data scheme format.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A split data error correction code (ECC) circuit comprising:
    a control circuit coupled to an error correction code (ECC) circuit; and
    wherein the ECC circuit is adapted to generate at least one ECC code from user data of a first physical sector during a data access, and where the split data ECC circuit is adapted to write the at least one ECC code to a second physical sector if the data access is a write access and to compare the at least one generated ECC code with at least one ECC code stored in a second physical sector if the data access is a read access.

2. The split data ECC circuit of claim 1, wherein first and second physical sectors contain multiple logical sectors and ECC code data areas, and wherein the split data ECC circuit is adapted to generate an ECC code for each accessed logical sector of the first physical sector.

3. The split data ECC circuit of claim 1, wherein the data access is a sequential access that progresses from the first physical sector to the second physical sector.

4. The split data ECC circuit of claim 1, wherein the split data ECC circuit further comprises:
    a RAM storage circuit coupled to the control circuit and the ECC circuit, wherein the split data ECC circuit is adapted to store the at least one generated ECC code in the RAM storage unit.

5. The split data ECC circuit of claim 1, wherein the first and second physical sectors are from differing erase blocks of a superblock.

6. The split data ECC circuit of claim 1, wherein the ECC circuit is adapted to generate and compare ECC data codes to detect data errors during a data read access.

7. The split data ECC circuit of claim 6, wherein the ECC circuit is adapted to correct user data during a data read access.

8. The split data ECC circuit of claim 1, wherein the first physical sector is addressed as physical sector m and where the second physical sector is addressed as physical sector m−1.

9. The split data ECC circuit of claim 1, wherein the first physical sector is addressed as physical sector m and where the second physical sector is addressed as physical sector m+1.

10. The split data ECC circuit of claim 1, wherein the first physical sector is a final physical sector and where the second physical sector is an initial physical sector of an erase block.

11. A split data error correction code (ECC) circuit comprising:
    a storage circuit;
    an error correction code (ECC) circuit coupled to the storage circuit; and
    a control circuit coupled to the ECC circuit and coupled to the storage circuit;
    wherein the ECC circuit is adapted to generate at least one ECC code from user data of a first physical sector during a write access of the first physical sector and to write the at least one ECC code to the storage circuit; and
    wherein the split data ECC circuit is adapted to write the at least one ECC code from the storage circuit to a second physical sector during a write access of the second physical sector.

12. The split data ECC circuit of claim 11, further comprising:

wherein the ECC circuit is adapted to generate at least one second ECC code from user data of the second physical sector during the write access of the second physical sector and to write the at least one second ECC code to the storage circuit; and wherein the split data ECC circuit is adapted to write the at least one second ECC code from the storage circuit to a third physical sector during a write access of the third physical sector.

13. The split data ECC circuit of claim 12, wherein the second physical sector is a next sequentially addressed physical sector from the first physical sector, and wherein the third physical sector is a next sequentially addressed physical sector from the second physical sector.

14. The split data ECC circuit of claim 11, further comprising:

wherein the ECC circuit is adapted to generate at least one second ECC code from user data of the second physical sector during a subsequent write access of the second physical sector and to write the at least one second ECC code to the storage circuit; and wherein the split data ECC circuit is adapted to write the at least one second ECC code from the storage circuit to the first physical sector during a subsequent write access of the first physical sector.

15. The split data ECC circuit of claim 11, wherein the write access of the first physical sector and the write access of the second physical sector are part of a sequential write access that progresses from the first physical sector to the second physical sector.

16. A split data error correction code (ECC) circuit comprising:

a storage circuit;

an error correction code (ECC) circuit coupled to the storage circuit; and a control circuit coupled to the ECC circuit and coupled to the storage circuit;

wherein the ECC circuit is adapted to generate at least one ECC code from user data of a first physical sector during a read access of the first physical sector and to write the at least one ECC code to the storage circuit; and wherein the split data ECC circuit is adapted to read stored ECC data from a second physical sector during a read access of the second physical sector, and to compare the at least one ECC code to the stored ECC data from the second physical sector to detect data errors in the user data of the first physical sector.

17. The split data ECC circuit of claim 16, wherein the second physical sector is a next sequentially addressed physical sector from the first physical sector.

18. The split data ECC circuit of claim 16, further comprising:

wherein the ECC circuit is adapted to generate at least one second ECC code from user data of the second physical sector during the read access of the second physical sector and to write the at least one second ECC code to the storage circuit; and wherein the split data ECC circuit is adapted to read stored ECC data from a third physical sector during a read access of the third physical sector, and to compare the at least one second ECC code to the stored ECC data from the third physical sector to detect data errors in the user data of the second physical sector.

19. The split data ECC circuit of claim 16, wherein the write access of the first physical sector and the write access of the second physical sector are part of a sequential write access that progresses from the first physical sector to the second physical sector.

20. The split data ECC circuit of claim 16, further comprising:

wherein the ECC circuit is adapted to generate at least one second ECC code from user data of the second physical sector during a subsequent read access of the second physical sector and to write the at least one second ECC code to the storage circuit; and wherein the split data ECC circuit is adapted to read stored ECC data from the first physical sector during a subsequent read access of the first physical sector, and to compare the at least one second ECC code to the stored ECC data from the first physical sector to detect data errors in the user data of the second physical sector.

* * * * *